United States Patent
Schuster

(12) 
(10) Patent No.: US 6,483,573 B1
(45) Date of Patent: Nov. 19, 2002

(54) PROJECTION EXPOSURE SYSTEM AND AN EXPOSURE METHOD IN MICROLITHOGRAPHY

(75) Inventor: Karl-Heinz Schuster, Koenigsbronn (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/504,663

(22) Filed: Feb. 14, 2000

(30) Foreign Application Priority Data

May 11, 1999 (DE) .......................... 199 21 795

(51) Int. Cl.[7] .................. G03B 27/72; G03B 27/54; H01S 3/10
(52) U.S. Cl. .............. 355/71; 355/67; 372/26; 372/27
(58) Field of Search ............. 355/67, 71; 372/26, 372/27; 359/237, 246, 264; 362/19

(56) References Cited

U.S. PATENT DOCUMENTS 5,309,535 A * 5/1994 Bergano et al. ............ 385/38
5,673,103 A 9/1997 Inoue et al. ................ 355/71

* cited by examiner

*Primary Examiner*—Rodney Fuller
(74) *Attorney, Agent, or Firm*—Welsh & Katz, Ltd.

(57) ABSTRACT

A projection exposure system having a light source generating a pulsed light, in particular a laser 1 generating linearly polarized light, is provided with an illuminating beam path, with an illuminating device 2 and a lens system 3 as objective. A rotating element 7 changing the polarization is preferably arranged between the light source 1 and the illuminating device 2 in the illuminating beam path in such a way that the polarizing effects of the pulses cancel one another out in the illuminating device 2.

12 Claims, 1 Drawing Sheet

PROJECTION EXPOSURE SYSTEM AND AN EXPOSURE METHOD IN MICROLITHOGRAPHY

Figure 1:
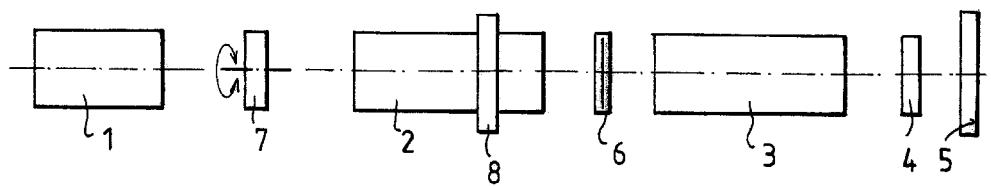

The invention relates to a projection exposure system having a light source generating a pulsed light according to the type defined in more detail in the preamble of claim 1. The invention also relates to an exposure method in microlithography.

In conjunction with linearly polarized light sources such as, for example, lasers, illuminating devices of projection exposure systems, in particular lithography objectives, have optical polarization properties which no longer meet the current requirements in all cases. Frequently, linearly polarized laser light with a polarization degree of approximately 90–95° is rendered circular by means of a lambda/4 plate. The aim is to maintain this circular state up to a wafer which is to be exposed. However, it is disadvantageous that the optical components in the illuminating system, in the objective and reticle structures introduce phase differences. As a result, the original circular laser light acquires an elliptical polarization state. The disadvantage of this is the production of an uncontrolled state which varies from objective and illumination with reference to the respective next pair. This results in nonuniform brightness distributions over the image field and uncontrolled influences on the imaging and the image production.

These errors can presently be reduced only by materials which have little stress, mirror coatings which maintain polarization, dispensing with a glass rod and the like, all of which is possible, however, only at considerable outlay.

U.S. Pat. No. 5,673,103 describes an illuminating system in photolithography, an arrangement for rotating the polarization direction with the aid of a lambda/2 plate being provided. In order to achieve illumination with linearly polarized light of changing direction in conjunction with enhanced resolution or depth of field, the lamda/2 plate is rotated toward a focusing lens and an optical integrator.

It is the object of the present invention to create a projection exposure system and an exposure method in microlithography in which the disadvantages of the prior art are avoided, in particular in which nonuniform brightness distribution over the image field and uncontrolled influences on the imaging and image production do not occur.

According to the invention, this object is achieved by means of the features named in the characterizing part of claim 1.

An exposure method according to the invention is described in claim 11.

Using the system and the method according to the invention, it is possible in practice to leave virtually unchanged the known systems without complicated changes and yet, in the process, necessarily to bring about an optical polarization effect, specifically to expose the wafer in an unpolarized fashion. This purpose is served by the element changing the polarization. This can, for example, be achieved in a simple way by a lambda/2 plate which is arranged between the end of the beam feed of the linearly polarized light and the input of the illuminating device or the illuminating system.

It is known that a lambda/2 plate rotates the polarization direction of a linear light. If, in this case, the lambda/2 plate rotates with its axis, which is situated on the optical axis or parallel thereto, then the emerging linear laser light rotates with its vibration direction at this double frequency. The individual pulse of the light source, for example a litholaser, can now be synchronized with the rotary movement of the lambda/2 plate. In this case, the lambda/2 plate rotates further by 45° from pulse to pulse. The laser light entering the illuminating system remains linear and changes in each case by 90° from pulse to pulse. If a defined position of the crystal axis relative to the pulse in the lambda/2 plate has been set, that is to say 0°, 45°, 90°, 135°, 180° etc., the polarization can reach approximately 0° and 90° relative to the mirror edges of the illuminating system. The decisive point in this is: 0° and 90° polarization between two pulses is now exactly orthogonal. If an exposure is now carried out with the aid of these two orthogonal pulses which integrates the resist of the wafer, this corresponds in sum as regards the result of exposure precisely to that of two completely unpolarized pulses. This means a cancellation of the polarized light or virtually depolarized light. There are always a sufficient number of exposure pairs present owing to the high frequency in the case, for example, of the use of litholasers at approximately 2000 to 8000 Hz.

In practice, the pulses mutually cancel one another out in their polarization effects downstream of the lambda/2 plate, specifically in pairs, or they supplement one another to produce an unpolarized effect.

If a lambda/4 plate, for example, is left in the illuminating system, the result in the presence of phase lags is a pulse pair with left-elliptically polarized light and right-elliptically polarized light, which is equivalent to entirely circular light in exposure, and this is the aim of the existing systems.

Polarization-rotating elements in the downstream beam path thus do not disturb the effect according to the invention. Polarization-selecting elements have their interference at least reduced.

The additional outlay in the system owing to a rotating synchronized lambda/2 plate is negligible by comparison with known devices for avoiding the disadvantages outlined.

A further advantage of the invention consists in that it is also possible for subsequently existing projection exposure systems to be depolarized in this way, the result being to produce new possible applications in a cost effective way.

Figure 2:
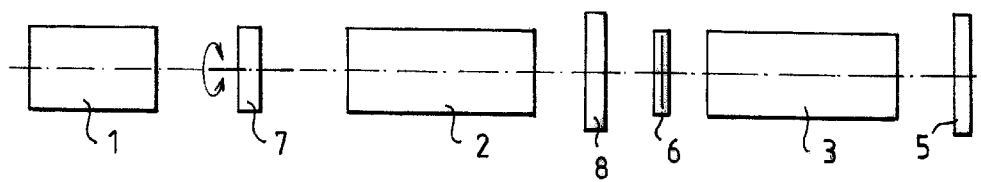

Two exemplary embodiments of the invention are described in principle below with the aid of the drawing, in which:

FIG. 1 shows an embodiment of a projection exposure system with the essential components, and FIG. 2 shows a modified embodiment of the projection exposure system according to FIG. 1.

From a laser 1 as light source which generates linearly polarized pulses, light is fed in the illuminating beam path of an illuminating device 2 downstream of which an objective 3 is connected in the beam path. The objective 3 can be followed by a plate polarizer 4, starting from which radially polarized light then again reaches a wafer 5.

A reticle 6 is arranged between the illuminating device 2 and the objective 3.

The illuminating beam path multifariously comprises a light guiding system having deflecting mirrors, beam position stabilization etc. and the actual illuminating device, which produces the illumination of the reticle 6 with a suitable field size, aperture, homogeneity, degree of coherence, etc.

There is now arranged in the beam path between the laser light source 1 and the illuminating device 2 a lambda/2 plate 7 which can be rotated about its axis by a device which is not represented, the axis of rotation corresponding to the optical axis. Parts of the illuminating device can also be arranged upstream of the lambda/2 plate. The rotation of the lambda/2 plate 7 is synchronized in this case with the individual pulses of the laser light source 1, in which case it rotates further from pulse to pulse by 45°. In this way, the lambda/2 plate 7 generates an orthogonal polarization from pulse to pulse, the downstream plate polarizer 4, which is constructed in the form of a coated end plate, generating a radial polarization (see DE P 19535392-7). The combination of these two components reduces the problems with variations in illumination over the image field. It is also possible in this way to retrofit an existing objective 3 cost-effectively for radial polarization.

The system also functions with an illuminating device 2 which does not operate neutrally in terms of optical polarization.

As is mostly customary, a lambda/4 plate 8 can also remain integrated in the illuminating device 2.

The rotating lambda/2 plate 7 can also be used very effectively in conjunction with a birefringent reticle in accordance with the exemplary embodiment according to FIG. 2. As may be seen, the exemplary embodiment according to FIG. 2 corresponds essentially to the exemplary embodiment according to FIG. 1, for which reason the same reference numerals have also been retained for the same components. The only difference here is that a fixed lambda/4 plate 8, which is, however, of no importance itself for the method in this form, is arranged downstream of the illuminating device 2. Moreover, the plate polarizer downstream of the objective 3 has been dispensed with.

In this case, as well, vertically or horizontally polarized light is generated in temporal sequence again by the lambda/2 plate 7. From pulse to pulse, the lambda/2 plate 7 therefore generates laser light polarized right-elliptically or left-elliptically. As a result of this, all the pulses through the reticle. (Mg $F_2$ plate) 6 change orthogonally in sequence. The phase difference rises continuously over the aperture. The polarization states change continuously as a result. This means that the wafer 5 is therefore illuminated in principle entirely without polarization. The effect of a birefringent reticle plate, for example made from Mg $F_2$ as proposed for 157 nm lithography, is therefore of no importance as regards the polarization state. The possible birefringence of the reticle plate is then likewise of no importance for the imaging of the glass rod in the stop plane of the objective 3.

In the case of reticles which are used in reflection, the polarization mixture in accordance with the invention likewise has large advantages in the avoidance of interference due to polarization.

What is claimed is:

1. A projection system having a light source generating a pulsed light, and an object, wherein a rotating element changing the polarization is arranged between the light source and the illuminating device in the illuminating beam path in such a way that the polarization of the pulsed light is reduced in the exposure of said object, wherein the rotating element is synchronized with the individual pulses of the light source.

2. The projecting exposure system as claimed in claim 1, wherein as a rotating element a lambda/2 plate is arranged between the light source and the illuminating device as an element changing the polarization.

3. The projection exposure system as claim in claim 2, wherein the lambda/2 plate can be rotated about its optical axis during the individual pulses of the light source.

4. The projection exposure system as claimed in claim 1, wherein the lambda/2 plate can be rotated by 45° from pulse to pulse.

5. The projection exposure system as claimed in claim 1, wherein a lambda/4 plate is arranged in the system.

6. The projection exposure system as claimed in claim 1, wherein a plate polarizer is connected downstream of the element changing the polarization.

7. The projection exposure system as claimed in claim 6, wherein the plate polarizer is arranged downstream of the illuminating device.

8. The projection exposure system as claimed in claim 6, wherein a birefringent reticle is provided as plate polarizer.

9. The projection exposure system as claimed in claim 8, wherein the plate polarizer or the reticle is constructed as a coated end plate.

10. The projection exposure system of claim 1, wherein said light source comprises a laser generating a linearly polarized light with an illuminating beam path through a lens system.

11. The projection exposure system having a light source generating a pulsed light and an object, wherein a lambda/2 plate changing the polarization is arranged between the light source and the illuminating device in the illuminating beam path in such a way that the polarization of a light pulse is reduced in the exposure of said object by a rotation of the lambda/2 plate about its optical axis during the individual pulses of the light source, wherein the rotation of the lambda/2 plate is synchronized with the individual pulses of the light source.

12. A projection exposure method generating a pulsed light with polarization from a light source, wherein an element changing the polarization is rotated in synchronization with the individual pulses of the light source, comprising the steps of illuminating a reticle with a series of pulses, projecting the light from said reticle onto an object by a projection lens and exposing said object with reduced polarization.

* * * * *